United States Patent
Zeng et al.

(10) Patent No.: US 11,988,713 B2
(45) Date of Patent: May 21, 2024

(54) CONTACT SIGNAL ACQUISITION CIRCUIT FOR ON-SITE ON-LINE CHECK OF GAS DENSITY RELAY

(71) Applicant: SHANGHAI ROYE ELECTRIC CO., LTD., Shanghai (CN)

(72) Inventors: Wei Zeng, Shanghai (CN); Min Chang, Shanghai (CN); Xiaobeng Huang, Shanghai (CN); Haiming Liao, Shanghai (CN); Haisheng Jin, Shanghai (CN); Enlin Wang, Shanghai (CN)

(73) Assignee: Shanghai Roye Electric Co., Ltd., Shanghai (CN)

( * ) Notice: Subject to any disclaimer, the term of this patent is extended or adjusted under 35 U.S.C. 154(b) by 217 days.

(21) Appl. No.: 17/640,774

(22) PCT Filed: Aug. 26, 2020

(86) PCT No.: PCT/CN2020/111253
§ 371 (c)(1),
(2) Date: Mar. 4, 2022

(87) PCT Pub. No.: WO2021/043041
PCT Pub. Date: Mar. 11, 2021

(65) Prior Publication Data
US 2022/0308112 A1  Sep. 29, 2022

(30) Foreign Application Priority Data

Sep. 4, 2019  (CN) .......................... 201910830210.6

(51) Int. Cl.
*G01R 31/327* (2006.01)
*G01N 9/00* (2006.01)
*H01H 35/24* (2006.01)

(52) U.S. Cl.
CPC .......... *G01R 31/3274* (2013.01); *G01N 9/00* (2013.01); *H01H 35/24* (2013.01)

(58) Field of Classification Search
CPC ............ G01R 31/3274; G01R 31/3271; G01R 31/3272; G01R 31/327; G01N 9/00;
(Continued)

(56) References Cited

U.S. PATENT DOCUMENTS

| | | | | |
|---|---|---|---|---|
| 6,008,733 A | * | 12/1999 | Okano | H02J 13/00009 340/6.16 |
| 2017/0163022 A1 | * | 6/2017 | Kang | H02H 3/05 |
| 2023/0160800 A1 | * | 5/2023 | Huang | G01R 31/327 73/30.02 |

FOREIGN PATENT DOCUMENTS

| CN | 202084170 | 12/2011 |
|---|---|---|
| CN | 110411892 | 11/2015 |

(Continued)

OTHER PUBLICATIONS

Gang Wei et al.; Signal transmission module for non-contact SF6 (sulfur hexafluoride) density relay; Publication CN202084170U; Dec. 21, 2011; Chongqing Electric Power Corp Maintenance Branch Co Ltd; IPC G08C17/02 (Year: 2011).*

*Primary Examiner* — Nasima Monsur
(74) *Attorney, Agent, or Firm* — Hsuanyeh Law Group, PC (57) ABSTRACT

A contact signal acquisition circuit for online checking a gas density relay on site is provided, including a first connecting circuit, connecting a contact of a gas density relay to a contact signal control loop, and a second connecting circuit, connecting a contact of the gas density relay to a contact signal sampling interface of an online check device. In a non-checking state, the second connecting circuit is disconnected, and the first connecting circuit is closed; and in a checking state, the first connecting circuit is disconnected, (Continued)

and the second connecting circuit is connected, so as to connect the contact of the gas density relay to the contact signal sampling interface of the online check device, guaranteeing that no contact action signal is uploaded during checking and safe operation of a power grid is not affected.

19 Claims, 2 Drawing Sheets

(58) Field of Classification Search
CPC .... H01H 35/24; H01H 47/002; H01H 33/563; H01H 35/26; G05B 19/042; G05B 19/04; G01D 21/02
See application file for complete search history.

(56) References Cited

FOREIGN PATENT DOCUMENTS

| | | |
|---|---|---|
| CN | 107064792 | 8/2017 |
| CN | 207502600 | 6/2018 |
| CN | 109752649 | 5/2019 |
| CN | 110416022 | 11/2019 |
| CN | 110426312 | 11/2019 |
| CN | 110426314 | 11/2019 |
| CN | 110426628 | 11/2019 |
| CN | 110535058 | 12/2019 |
| CN | 110542854 | 12/2019 |
| CN | 110554309 | 12/2019 |
| CN | 110888054 | 3/2020 |
| CN | 210514004 | 5/2020 |
| CN | 210863441 | 6/2020 |
| CN | 210923904 | 7/2020 |
| CN | 211043025 | 7/2020 |
| KR | 20170061210 | 6/2017 |

\* cited by examiner

CONTACT SIGNAL ACQUISITION CIRCUIT FOR ON-SITE ON-LINE CHECK OF GAS DENSITY RELAY

CROSS-REFERENCE TO RELATED APPLICATIONS

The present disclosure claims the priority of Chinese Patent Application No. 201910830210.6, filed on Sep. 4, 2019 and entitled Contact Signal Acquisition Circuit for Online Checking Gas Density Relay on Site.

TECHNICAL FIELD

The present disclosure relates to the technical field of electric power, in particular to a contact signal acquisition circuit (collector) for online checking a gas density relay on site, which is applied to high-voltage electrical equipment.

BACKGROUND

A gas density relay is generally used for monitoring and controlling density of insulating gas in high-voltage and medium-voltage electrical equipment, and is internally provided with a contact signal control loop. Its gas path is connected to gas chambers of the high-voltage and medium-voltage electrical equipment. When gas leakage is tested, a contact of the gas density relay acts to generate a contact signal, based on which, the contact signal control loop gives an alarm or blocks, so as to protect safe operation of the electrical equipment.

At present, wide applying of sulfur hexafluoride (SF6) electrical equipment to electric power departments and industrial and mining enterprises promotes rapid development of electric power industry. In recent years, with rapid economic development, installed capacity of an electric power system in China has expanded rapidly, and the use quantity of the SF6 electrical equipment has been increasing. The SF6 gas acts like arc extinguishing and insulation in the high-voltage electrical equipment. If the density of the SF6 gas in the high-voltage electrical equipment decreases and a micro-water content exceeds standards, safe operation of the SF6 high-voltage electrical equipment may be seriously affected. 1) Specifically, density decrease of the SF6 gas to a certain extent will lead to failures of insulation and arc extinguishing. 2) With participation of some kinds of metal, the SF6 gas can hydrolyze with water at 200° C. or above to generate active HF and SOF2, which corrodes insulators and metal members, and a large amount of heat is further produced to increase pressure of the gas chamber accordingly. 3) When the temperature drops, too much moisture may form condensation, which significantly reduces the surface insulation strength of the insulators, and even causes flashovers and serious harm. Therefore, as mandatorily required by regulations of power grid operation, the density and the water content of the SF6 gas must be regularly tested before the device is put into operation and in operation.

As an unattended substation develops towards networking and digitalization and the requirements for remote control and telemetry are increasingly strengthened, online monitoring of the gas density and the micro-water content of the SF6 electrical equipment has important practical significance. As smart power grids has rapidly developed constantly in China, the smart high-voltage electrical equipment, as an important component and a key node of the smart substation, plays a prominent role in security of the smart power grids. Most of the high-voltage electrical equipment are SF6 gas insulated devices at present. Decrease (due to leakage, etc. for example) of the gas density will seriously affect electrical performance of the device and cause serious hidden dangers to safe operation. It is very common to online monitor a gas density value in the SF6 high-voltage electrical equipment currently. An existing gas density monitoring system (device) basically 1) uses a remote SF6 gas density relay for collecting and uploading the density, the pressure and the temperature and achieving online monitoring the gas density, and 2) uses a gas density transmitter for collecting and uploading the density, the pressure and the temperature, and achieving online monitoring the gas density. The SF6 gas density relay is the core and key component. However, the remote SF6 gas density relay in a gas density monitoring system (device) currently used is composed of a mechanical density relay and an electronic remote transmission portion because of harsh on-site operation environment of a high-voltage substation, especially strong electromagnetic interference. In addition, a traditional mechanical density relay is still used in a power grid system with the gas density transmitter, has one group, two groups or three groups of mechanical contacts, and transmits, when the pressure reaches an alarm, blocking or overpressure state, information to a target device terminal by means of a contact connecting circuit in time, so as to guarantee safe operation of the device. In addition, the monitoring system is further equipped with a safe and reliable circuit transmission function, which establishes an effective platform for real-time data remote data reading and information monitoring, and can timely transmit information such as the pressure, the temperature and the density to the target device (such as a computer terminal) to achieve online monitoring.

Periodic inspection of the gas density relay on the SF6 electrical equipment is a necessary preventive measure to guarantee the safe and reliable operation of the SF6 electrical equipment, which is also required by "Preventive Test Codes for Electric Power Equipment" and "Twenty-five Key Requirements for Preventing Severe Accidents during Power Generation". From the view of actual operation, periodic check on the gas density relay is one of necessary means to guarantee the safe and reliable operation of a power device. Therefore, at present, check on the SF6 gas density relay has been highly valued and popularized in the power system, and has been implemented by all power supply companies, power plants and large industrial and mining enterprises that require testers, device vehicles and high-value SF6 gas for completing on-site check and testing of the gas density relay. With operating loss due to power failure during testing included, it is roughly calculated that annual testing cost of each high-voltage switching station is about tens of thousands to hundreds of thousands yuan. In addition, there are still potential safety hazards unless the testers operate in a standardized way. As a result, it is very necessary to innovate on the basis of the existing gas density relay, a gas density relay or a monitoring system composed thereof that achieves online monitoring of the gas density also has a check function of the gas density relay, so as to complete periodic check on the (mechanical) gas density relay. In this way, no testers are required to work on site, which greatly improves efficiency and reduces the cost. In addition, the online self-checking gas density relay or the monitoring system composed thereof can accurately measure a micro-water value inside the gas chamber of the electrical equipment.

SUMMARY

An objective of the present disclosure is to provide a contact signal acquisition circuit (collector) for online checking a gas density relay on site, which is applied to high-voltage electrical equipment. by means of the contact signal acquisition circuit for online checking a gas density relay on site, while gas density of a gas insulated or arc extinguishing electrical equipment is monitored, the gas density relay is online checked, thus improving efficiency, reducing operation and maintenance cost and guarantee safe operation of a power grid.

In order to achieve the above objective, the present disclosure uses the following technical solution:

The present disclosure provides the contact signal acquisition circuit (collector) for online checking a gas density relay on site. Preferably, the contact signal acquisition circuit (collector) for online checking a gas density relay on site is connected to the gas density relay and an online check device on the electrical equipment, and is configured to sample a contact signal of the gas density relay, and the contact signal includes an alarm signal and/or a blocking signal.

The contact signal acquisition circuit includes a first connecting circuit and a second connecting circuit, the first connecting circuit connecting a contact of the gas density relay to a contact signal control loop, and the second connecting circuit connecting the contact of the gas density relay to a contact signal sampling interface of an online check device, where

- in a non-checking state, the contact is a normally open density relay, the second connecting circuit is disconnected or broken, and the first connecting circuit is closed; and in a checking state, the first connecting circuit is disconnected, and the second connecting circuit is connected, so as to connect the contact of the gas density relay to the contact signal sampling interface of the online check device; alternatively,
- in a non-checking state, the contact is a normally closed density relay, the second connecting circuit is disconnected or broken, and the first connecting circuit is closed; and in a checking state, the contact signal control loop is closed, the contact of the gas density relay is disconnected from the contact signal control loop, and the second connecting circuit is connected, so as to connect the contact of the gas density relay to the contact signal sampling interface of the online check device.

Preferably, the first connecting circuit includes a contact signal control loop breaker, the contact signal control loop breaker being connected to the contact signal control loop of the gas density relay in series or in parallel, and the second connecting circuit includes a contact signal sampler, the contact signal sampler being connected to the contact of the gas density relay and the contact signal sampling interface of the online check device.

More preferably, the contact signal control loop breaker includes one or more of an electrically controlled relay, a small electrically controlled switch, an optocoupler, a silicon controlled rectifier, a metal oxide semiconductor (MOS) field effect transistor and a bipolar junction transistor.

More preferably, the contact signal sampler includes one or more of an electrically controlled relay, a small electrically controlled switch, an optocoupler, a silicon controlled rectifier, a MOS field effect transistor and a bipolar junction transistor.

More preferably, the contact signal control loop breaker is a first relay, and the contact signal sampler is a second relay, the first relay being provided with at least one normally closed contact, and the second relay being provided with at least one normally open contact, the normally closed contact and the normally open contact being opposite in connection/disconnection state, the normally closed contact being connected in series to the contact signal control loop, and the normally open contact being connected to the contact of the gas density relay; and in the non-checking state, the normally closed contact is closed, the normally open contact is disconnected, and the gas density relay monitors an output state of the contact in real time; and in the checking state, the normally closed contact is disconnected, the normally open contact is closed, and the contact of the gas density relay is connected to the contact signal sampling interface of the online check device by means of the normally open contact.

Further, the first relay and the second relay are two independent relays or the same relay.

Preferably, the second connecting circuit further includes a photocoupler and a resistor, the photocoupler including a light-emitting diode and a phototransistor, the light-emitting diode being connected in series to the contact of the gas density relay to form a closed loop, an emitter of the phototransistor being grounded, a collector of the phototransistor being connected to the online check device, and the collector of the phototransistor being further connected to a power supply by means of the resistor;

when the contact is closed, the closed loop is energized, the light-emitting diode emits light, the phototransistor is switched on by the light, and the collector of the phototransistor outputs a low level; and when the contact is disconnected, the closed loop is disconnected, the light-emitting diode does not emit light, the phototransistor is switched off, and the collector of the phototransistor outputs a high level.

Preferably, the second connecting circuit further includes a first photocoupler and a second photocoupler;

a light-emitting diode of the first photocoupler and a light-emitting diode of the second photocoupler are connected in parallel by means of a current limiting resistor, and then connected in series to the contact of the gas density relay to form a closed loop, and the light-emitting diode of the first photocoupler and the light-emitting diode of the second photocoupler are opposite in connection direction;

a collector of a phototransistor of the first photocoupler and a collector of a phototransistor of the second photocoupler each are connected to a power supply by means of a divider resistor, and an emitter of the phototransistor of the first photocoupler is connected to an emitter of the phototransistor of the second photocoupler to form an output end, the output end being connected to the online check device and grounded by means of a resistor;

when the contact is closed, the closed loop is energized, the first photocoupler is switched on, the second photocoupler is switched off, and the emitter of the phototransistor of the first photocoupler outputs a high level; alternatively, the first photocoupler is switched off, the second photocoupler is switched on, and the emitter of the phototransistor of the second photocoupler outputs a high level; and when the contact is disconnected, the closed loop is disconnected, the first photocoupler and the second photocoupler are switched off, and the emitter of a phototransistor of the first photocoupler and the emitter of a phototransistor of the second photocoupler output low levels.

More preferably, the second connecting circuit further includes a first zener diode group and a second zener diode group, the first zener diode group and the second zener diode group being connected in parallel to the contact signal control loop, the first zener diode group and the second zener diode group being opposite in connection direction, and the first zener diode group and the second zener diode group each being composed of one, two or more zener diodes connected in series.

Further, the first zener diode group includes a first zener diode and a second zener diode connected in series, a cathode of the first zener diode is connected to an anode of the second zener diode, the second zener diode group includes a third zener diode and a fourth zener diode connected in series, and an anode of the third zener diode is connected to a cathode of the fourth zener diode.

Preferably, the second connecting circuit further includes a first Hall current sensor and a second Hall current sensor, the first Hall current sensor, the second Hall current sensor and the contact of the gas density relay are connected in series to form a closed loop, the contact of the gas density relay is connected between the first Hall current sensor and the second Hall current sensor, and an output end of the first Hall current sensor and an output end of the second Hall current sensor are both connected to the online check device;
when the contact is closed, the closed loop is energized, and a current flows between the first Hall current sensor and the second Hall current sensor to generate induced electromotive force; and
when the contact is disconnected, the closed loop is disconnected, no current flows between the first Hall current sensor and the second Hall current sensor to generate zero induced electromotive force.

Preferably, the second connecting circuit further includes a first silicon controlled rectifier, a second silicon controlled rectifier, a third silicon controlled rectifier and a fourth silicon controlled rectifier; and
the first silicon controlled rectifier and the third silicon controlled rectifier, which are connected in series, as well as the second silicon controlled rectifier and the fourth silicon controlled rectifier, which are connected in series, form a series-parallel closed loop with a series circuit composed of the first silicon controlled rectifier and the third silicon controlled rectifier, one end of the contact of the gas density relay is electrically connected to a circuit between the first silicon controlled rectifier and the third silicon controlled rectifier by means of a circuit, and the other end of the contact of the gas density relay is electrically connected to a circuit between the second silicon controlled rectifier and the fourth silicon controlled rectifier by means of a circuit.

More preferably, a cathode of the first silicon controlled rectifier is connected to the online check device, an anode of the first silicon controlled rectifier is connected to a cathode of the third silicon controlled rectifier, a control electrode of the first silicon controlled rectifier and a control electrode of the third silicon controlled rectifier are connected to the online check device, a cathode of the second silicon controlled rectifier is connected to the online check device, an anode of the second silicon controlled rectifier is connected to a cathode of the fourth silicon controlled rectifier, and a control electrode of the second silicon controlled rectifier and a control electrode of the fourth silicon controlled rectifier are connected to the online check device.

Preferably, the contact signal acquisition circuit is provided with at least two independent sampling contacts for connecting the contacts, so as to break a contact signal control loop of the at least two contacts, transmit information when a contact signal acts, and achieve continuous measurement without changing the contact or reselecting the contact, where
the contact includes, but is not limited to, one of an alarm contact, an alarm contact+a blocking contact, an alarm contact+a blocking 1 contact+a blocking 2 contact, and an alarm contact+a blocking contact+an overpressure contact.

Preferably, the contact signal acquisition circuit is arranged on the gas density relay.

Preferably, the contact signal acquisition circuit and the online check device are arranged together.

Preferably, a voltage of the contact signal acquisition circuit for testing an action value or a switching value of the contact of the gas density relay is not less than 24 V, that is, during check, a voltage of not less than 24 V is applied between corresponding terminals of the contact.

Preferably, the contact signal acquisition circuit further includes a housing, and the contact signal acquisition circuit is arranged in the housing.

Preferably, the contact signal acquisition circuit further includes an anti-interference component.

Preferably, the contact signal acquisition circuit is further provided with a temperature protection device for components, which is used for guaranteeing that the components may work reliably at low or high ambient temperature.

More preferably, the temperature protection device includes a heater and/or a radiator (e.g., a fan), and the heater is turned on when a temperature is lower than a set value, and the radiator (e.g., a fan) is turned on when the temperature is higher than the set value.

Preferably, after the contact signal is checked, the online check device adjusts the contact signal acquisition circuit to the non-checking state, and in the non-checking state, the contact signal control loop of the gas density relay returns to the normal operation state.

The above electrical equipment includes SF6 gas electrical equipment, SF6 mixed gas electrical equipment, environment-friendly gas electrical equipment, or other insulating gas electrical equipment.

The gas density relay includes a bimetallic strip compensation gas density relay, a gas compensation gas density relay or a bimetallic strip and gas compensation mixed gas density relay, a completely mechanical gas density relay, a digital gas density relay, a combined mechanical and digital gas density relay, a gas density relay with pointer display, a digital display type gas density relay, a gas density switch without display or indication, a SF6 gas density relay, a SF6 mixed gas density relay, a N2 gas density relay, other gas density relays, etc.

Compared with the prior art, the present disclosure has the following beneficial effects:

The present disclosure provides the contact signal acquisition circuit (collector) for online checking a gas density relay, which is used for the high-voltage electrical equipment. The contact signal acquisition circuit is, when in the non-checking state, relatively broken by the contact of the gas density relay in circuits. In the checking state, the contact signal control loop is disconnected to guarantee that the contact signal of the gas density relay may not be uploaded and safe operation of the power grid may not be affected. In addition, the contact of the gas density relay is connected to the online check device to monitor the state of the contact of the gas density relay, and guarantee the safety of the online check device during check.

BRIEF DESCRIPTION OF DRAWINGS

Accompanying drawings, which constitute a portion of the present disclosure, are used to provide a further understanding of the present disclosure. Schematic embodiments of the present disclosure and descriptions thereof are used to explain the present disclosure, but not constitute an improper limit to the present disclosure. In the accompanying drawings.

DETAILED DESCRIPTION OF THE EMBODIMENTS

The present disclosure provides a contact signal acquisition circuit (collector) for online checking a gas density relay on site. In order to make an objective, a technical solution and effects of the present disclosure more clear and definite, the present disclosure will be further described below in detail with reference to the accompanying drawings and examples. It should be understood that the particular embodiments described herein are merely used to explain the present disclosure, and are not used to limit the present disclosure.

It should be noted that the terms "first", "second", etc. in the specification and claims of the present disclosure and the above accompanying drawings are used to distinguish similar objects, but are not necessarily used to describe a specific sequence or a precedence order. It should be understood that data used in this way can be interchanged under appropriate circumstances. In addition, terms "including", "having", and any variations thereof are intended to cover non-exclusive inclusions, for example, systems, products, or devices that include a series of units need not be limited to those clearly listed units, but may include other units not explicitly listed or inherent to the products, or devices.

Embodiment 1

Figure 1:
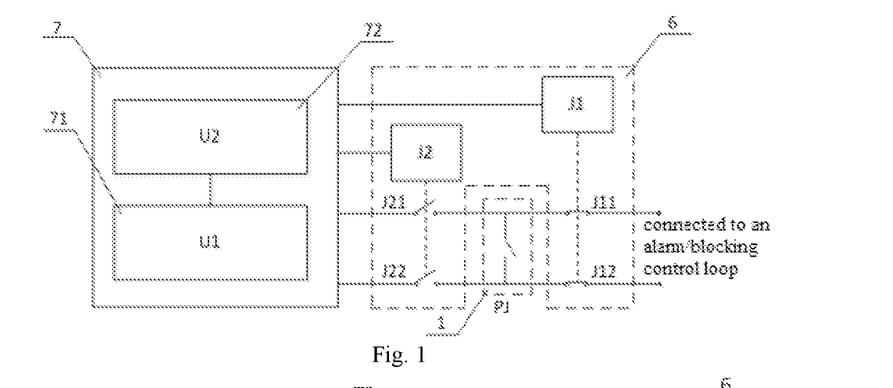
FIG. 1 is a schematic diagram of a control circuit of a preferred embodiment in the present disclosure.

FIG. 1 is a schematic diagram of a control circuit of a contact signal acquisition circuit (collector) 6, applied to high-voltage electrical equipment, for online checking a gas density relay. As shown in FIG. 1, the contact signal acquisition circuit (collector) is connected to a gas density relay 1 and an online check device 7 on the electrical equipment. The contact signal acquisition circuit (collector) 6 of this embodiment includes a first relay J1 and a second relay J2. The first relay J1 is provided with normally closed contacts J11 and J12, and the normally closed contacts J11 and J12 are connected in series to a contact signal control loop. The second relay J2 is provided with normally open contacts J21 and J22, and the normally open contacts J21 and J22 are connected to a contact $P_J$ of the gas density relay 1. Alternatively, the first relay J1 and the second relay J2 are integrated into a relay with normally open and normally closed contacts. In a non-checking state, the contact $P_J$ is a normally open density relay, the normally closed contacts J11 and J12 are closed, the normally open contacts J21 and J22 are disconnected, and the gas density relay monitors an output state of the contact $P_J$ in real time. In a checking state, the normally closed contacts J11 and J12 are disconnected, the normally open contacts J21 and J22 are closed, and the contact $P_J$ of the gas density relay 1 is connected to the online check device 7 by means of the normally open contacts J21 and J22.

The online check device 7 is mainly composed of a processor 71(U1) and a power supply 72(U2). The processor 71(U1) may be a general-purpose computer, an industrial control computer, a central processing unit (CPU), a single chip microcomputer, an ARM chip, an artificial intelligence (AI) chip, a microprogrammed control unit (MCU), a field programmable gate array (FPGA), a programmable logic controller (PLC), an industrial control main board, an embedded master control board, and other intelligent integrated circuits. The power supply 72(U2) may be a switching power supply, an alternating current (AC) 220 V, a direct current (DC) power supply, a low dropout regulator (LDO), a programmable power supply, solar energy, a storage battery, a rechargeable battery, a battery, etc.

Working Principle:

The online check device 7 obtains a pressure value $P_{20}$ (i.e. a gas density value) corresponding to 20° C. according to monitored gas pressure and temperature of the electrical equipment. When the gas density relay 1 needs to be checked, if the gas density value is $P_{20} \geq$ a set safety check density value $P_S$, the online check device 7 cuts off a gas path connecting the gas density relay 1 to the electrical equipment.

Then, by means of control by the online check device 7, the contact signal control loop of the gas density relay 1 is cut off, that is, the normally closed contacts J11 and J12 of the first relay J1 of the contact signal acquisition circuit (collector) 6 are disconnected, such that safe operation of the electrical equipment may not be affected when the gas density relay 1 is online checked, and an alarm signal may not be given by mistake or the contact signal control loop may not be blocked during check. Since the gas density value is monitored to determine whether $P_{20} \geq$ the set safety check density value $P_S$ before start of check, gas of the electrical equipment is within a safe operation range, and gas leakage proceeds slowly, such that safety is guaranteed during check. In addition, the normally open contacts J21 and J22 of the second relay J2 of the contact signal acquisition circuit (collector) 6 are closed under control by the online check device 7 or automatically closed. In this case, the contact $P_J$ of the gas density relay 1 is connected to a contact signal sampling interface of the online check device 7 by means of the normally open contacts J21 and J22 of the second relay J2.

Then, the online check device 7 controls gas pressure of the gas path of the gas density relay 1 to gradually decrease, such that the gas density relay 1 generates contact action, contact action is uploaded to the online check device 7 by means of the second relay J2 of the contact signal acquisition circuit (collector) 6, and the online check device 7 converts a pressure value and a temperature value measured during the contact action into a pressure value $P_{20}$ (a density value) corresponding to 20° C. according to gas features, such that a contact action value $P_{D20}$ (a gas density value during contact action) of the gas density relay may be tested. After all contact action values of an alarm signal and/or a blocking signal of the gas density relay 1 are tested, the online check device 7 controls the gas pressure of the gas path of the gas density relay 1 to gradually increase, and a return value (a gas density value when the contacts are reset) of the alarm contact and/or the lockout contact of the gas density relay 1 is tested. Check is repeated for several times (for example, 2-3 times) according to the process above, and then an average is calculated, thus completing check on the gas density relay 1.

After check is completed, the normally open contacts J21 and J22 of the second relay J2 of the contact signal acquisition circuit (collector) 6 are disconnected, and in this case, the contact $P_J$ of the gas density relay 1 is not connected to the online check device 7. The online check device 7 controls the gas density relay 1 to be connected, on the gas path, to the electrical equipment. Then, the normally closed contacts J11 and J12 of the first relay J1 of the contact signal acquisition circuit (collector) 6 are closed, the contact signal control loop of the contact signal acquisition circuit (collector) 6 works normally, and the gas density relay 1 safely monitors the gas density of the electrical equipment, such that the electrical equipment may work safely and reliably. In this way, online check on the gas density relay 1 may be conveniently completed without affecting the safe operation of electrical equipment.

Embodiment 2

Figure 2:
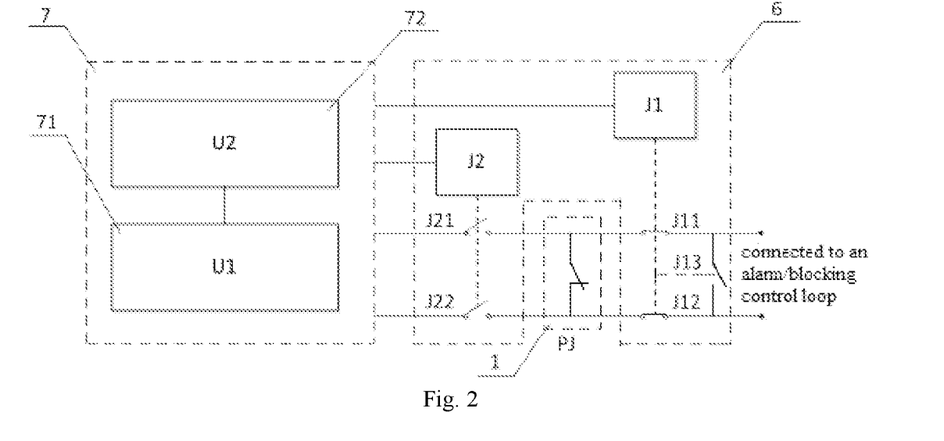
FIG. 2 is a schematic diagram of another control circuit of a preferred embodiment in the present disclosure.

As shown in FIG. 2, this embodiment is different from the first embodiment in that a normally open contact J13 is added between normally closed contacts J11 and J12. In a non-checking state, a contact $P_J$ is a normally closed density relay, the normally closed contacts J11 and J12 are closed, J13 is open, and normally open contacts J21 and J22 are disconnected. In a checking state, the normally open contact J13 of a contact signal acquisition circuit (collector) 6 closes a contact signal control loop, the normally closed contacts J11 and J12 are disconnected, that is, the contact $P_J$ of a gas density relay 1 is disconnected from the contact signal control loop. In addition, the normally open contacts J21 and J22 are closed under control by the online check device 7 or automatically closed, the contact $P_J$ of the gas density relay 1 is connected to a contact signal sampling interface of the online check device 7 by means of the normally open contacts J21 and J22 of a second relay J2.

Embodiment 3

Figure 3:
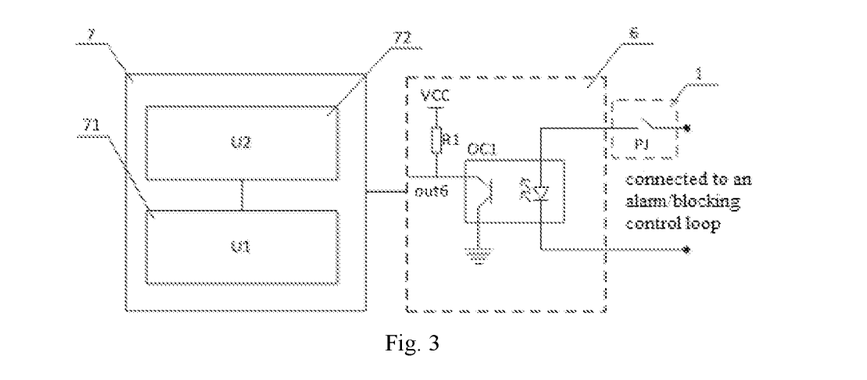
FIG. 3 is a schematic diagram of another control circuit of a preferred embodiment in the present disclosure.

As shown in FIG. 3, a contact signal acquisition circuit (collector) 6 in this embodiment includes a photocoupler OC1 and a resistor R1, the photocoupler OC1 includes a light-emitting diode and a phototransistor. An anode of the light-emitting diode and a contact $P_J$ of a gas density relay 1 are connected in series to form a closed loop, an emitter of the phototransistor is grounded, a collector of the phototransistor is, as an output end out 6 of the signal acquisition circuit (collector) 6, connected to an online check device 7, and the collector of the phototransistor is further connected to a power supply by means of the resistor R1.

By means of the above circuit, whether the contact $P_J$ of the gas density relay 1 is in a disconnected or closed state is conveniently known on the basis of a high level and a low level output at the output end out 6 of the contact signal acquisition circuit (collector) 6. Specifically, when the contact $P_J$ is closed, the closed loop is energized, the light-emitting diode emits light, the phototransistor is switched on by light, and the collector of the phototransistor outputs a low level. When the contact $P_J$ is disconnected, the closed loop is disconnected, the light-emitting diode does not emit light, the phototransistor is off, and the collector of the phototransistor outputs a high level.

In this embodiment, the online check device 7 is broken from a contact signal control loop by means of optoelectronic isolation, and when the contact $P_J$ is closed during check, or in the case of gas leakage, the contact $P_J$ may also be closed. In this case, the collector of the phototransistor is tested to output a low level. The contact $P_J$ is closed during check for time of a preset span, such that the span of closing of the contact $P_J$ during check is fixed without gas leakage. By monitoring the span of a received low level, it may be determined whether the contact $P_J$ is closed during check. Therefore, during check, it may be determined by recording the span that the gas density relay 1 gives an alarm signal during check rather than an alarm signal during gas leakage.

In this embodiment, the online check device 7 is mainly composed of a processor 71(U1) and a power supply 72(U2).

Embodiment 4

Figure 4:
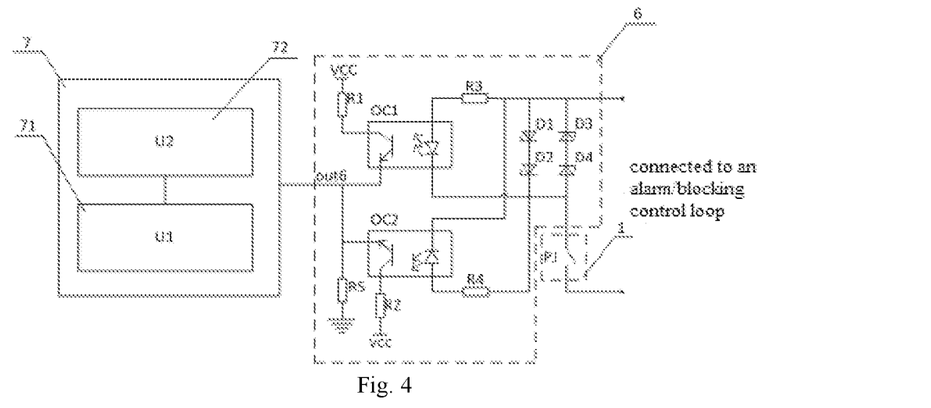
FIG. 4 is a schematic diagram of another control circuit of a preferred embodiment in the present disclosure.

As shown in FIG. 4, a contact signal acquisition circuit (collector) 6 in this embodiment includes a first photocoupler OC1 and a second photocoupler OC2.

A light-emitting diode of the first photocoupler OC1 and a light-emitting diode of the second photocoupler OC2 are connected in parallel by means of a current limiting resistor, and then connected in series to a contact $P_J$ of a gas density relay 1 to form a closed loop, and the light-emitting diode of the first photocoupler OC1 and the light-emitting diode of the second photocoupler OC2 are opposite in connection direction. A collector of a phototransistor of the first photocoupler OC1 and a collector of a phototransistor of the second photocoupler OC2 each are connected to a power supply by means of a divider resistor, and an emitter of the phototransistor of the first photocoupler OC1 is connected to an emitter of the phototransistor of the second photocoupler OC2 to form an output end out 6, the output end out 6 being connected to an online check device 7 and grounded by means of a resistor R5.

By means of the above circuit, whether the contact $P_J$ of the gas density relay 1 is disconnected or closed is conveniently known. Specifically, when the contact $P_J$ is closed, the closed loop is energized, the first photocoupler OC1 is switched on, the second photocoupler OC2 is switched off, and the emitter (that is the output end out 6) of the phototransistor of the first photocoupler OC1 outputs a high level. Alternatively, the first photocoupler OC1 is switched off, the second photocoupler OC2 is switched on, and the emitter (that is the output end out 6) of the phototransistor of the second photocoupler OC2 outputs a high level. When the contact $P_J$ is disconnected, the closed loop is disconnected, the first photocoupler OC1 and the second photocoupler OC2 are switched off, and the emitter (that is the output end out 6) of the phototransistor of the first photocoupler OC1 and the emitter (that is the output end out 6) of the phototransistor of the second photocoupler OC2 output low levels.

In a preferred embodiment, the above circuit further includes a first zener diode group and a second zener diode group, the first zener diode group and the second zener diode group being connected in parallel to the contact signal control loop, the first zener diode group and the second zener diode group being opposite in connection direction, and the first zener diode group and the second zener diode group each being composed of one, two or more zener diodes connected in series.

In this embodiment, the first zener diode group includes a first zener diode D1 and a second zener diode D2 connected in series, a cathode of the first zener diode D1 is connected to an anode of the second zener diode D2, the second zener diode group includes a third zener diode D3 and a fourth zener diode D4 connected in series, and an anode of the third zener diode D3 is connected to a cathode of the fourth zener diode D4.

The contact signal acquisition circuit (collector) 6 may conveniently monitor a state of the contact $P_J$ of the gas density relay 1. Combined with the online check device 7, whether the contact $P_J$ is in the disconnected state or in the closed state may be correspondingly processed and remotely transmitted, such that a contact signal state may be known from background, which greatly improves reliability of a power grid.

In this embodiment, the online check device 7 is mainly composed of a processor 71(U1) and a power supply 72(U2).

Embodiment 5

Figure 5:
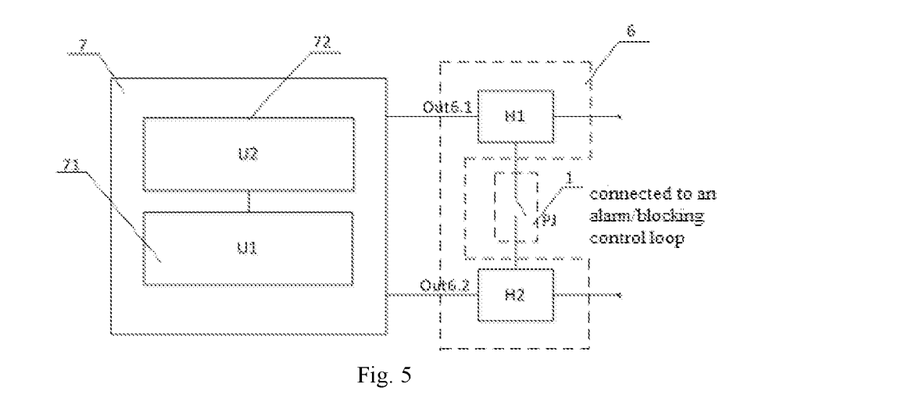
FIG. 5 is a schematic diagram of another control circuit of a preferred embodiment in the present disclosure.

As shown in FIG. 5, a contact signal acquisition circuit (collector) 6 in this embodiment includes a first Hall current sensor H1 and a second Hall current sensor H2. The first Hall current sensor H1, the second Hall current sensor H2 and a contact $P_J$ of a gas density relay 1 are connected in series to form a closed loop, the contact $P_J$ of the gas density relay 1 is connected between the first Hall current sensor H1 and the second Hall current sensor H2, and an output end of the first Hall current sensor H1 and an output end of the second Hall current sensor H2 are both connected to an online check device 7.

By means of the above circuit, whether the contact $P_J$ of the gas density relay 1 is disconnected or closed is conveniently known. Specifically, when the contact $P_J$ is closed, the closed loop is energized, and a current flows between the first Hall current sensor H1 and the second Hall current sensor H2 to generate induced electromotive force. When the contact $P_J$ is disconnected, the closed loop is disconnected, no current flows between the first Hall current sensor H1 and the second Hall current sensor H2 to generate zero induced electromotive force.

In this embodiment, the online check device 7 is mainly composed of a processor 71(U1) and a power supply 72(U2).

Embodiment 6

Figure 6:
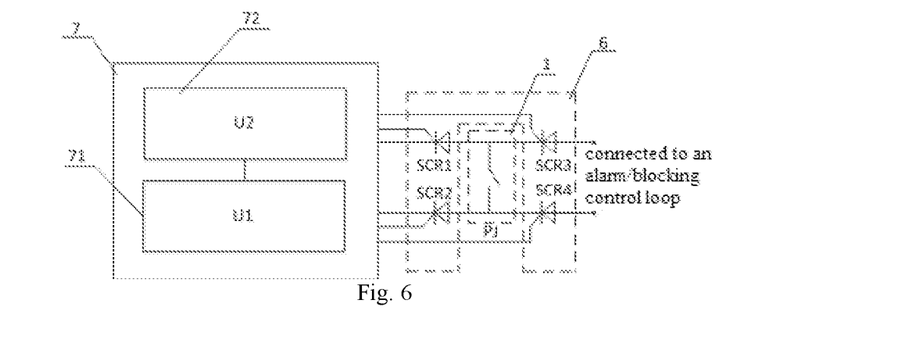
FIG. 6 is a schematic diagram of another control circuit in a preferred embodiment of the present disclosure.

As shown in FIG. 6, a contact signal acquisition circuit (collector) 6 in this embodiment includes a first silicon controlled rectifier SCR1, a second silicon controlled rectifier SCR2, a third silicon controlled rectifier SCR3 and a fourth silicon controlled rectifier SCR4.

The first silicon controlled rectifier SCR1 and the third silicon controlled rectifier SCR3, which are connected in series, as well as the second silicon controlled rectifier SCR2 and the fourth silicon controlled rectifier SCR4, which are connected in series, form a series-parallel closed loop with a series circuit composed of the first silicon controlled rectifier SCR1 and the third silicon controlled rectifier SCR3, one end of a contact $P_J$ of a gas density relay 1 is electrically connected to a circuit between the first silicon controlled rectifier SCR1 and the third silicon controlled rectifier SCR3, and the other end of the contact of the gas density relay is electrically connected to a circuit between the second silicon controlled rectifier SCR2 and the fourth silicon controlled rectifier SCR4 by means of a circuit. As shown in FIG. 6, series-parallel connection is a hybrid-connection circuit in which the above components are connected in parallel and in series.

Specifically, a cathode of the first silicon controlled rectifier SCR1 and a cathode of the second silicon controlled rectifier SCR2 are connected to form an output end of the contact signal acquisition circuit (collector) 6 to be connected to an online check device 7. An anode of the first silicon controlled rectifier SCR1 is connected to a cathode of the third silicon controlled rectifier SCR3, an anode of the second silicon controlled rectifier SCR2 is connected to a cathode of the fourth silicon controlled rectifier SCR4, an anode of the third silicon controlled rectifier SCR3 and an anode of the fourth silicon controlled rectifier SCR4 are connected to an input end of the signal acquisition circuit (collector) 6. Control electrodes of the first silicon controlled rectifier SCR1, the second silicon controlled rectifier SCR2, the third silicon controlled rectifier SCR3 and the fourth silicon controlled rectifier SCR4 are all connected to the online check device 7. The online check device 7 may control the corresponding silicon controlled rectifier to be connected or disconnected.

In this embodiment, the online check device 7 is mainly composed of a processor 71(U1) and a power supply 72(U2).

An operation process in this embodiment includes:

During normal operation without check, the contact $P_J$ is disconnected, and the contact signal acquisition circuit triggers the third silicon controlled rectifier SCR3 and the fourth silicon controlled rectifier SCR4. The third silicon controlled rectifier SCR3 and the fourth silicon controlled rectifier SCR4 are in a switch-on state, and the contact signal control loop is in an operation state. In this case, the contact signal acquisition circuit does not trigger the first silicon controlled rectifier SCR1 and the second silicon controlled rectifier SCR2, and the cathode of the first silicon controlled rectifier SCR1 and the cathode of the second silicon controlled rectifier SCR2 do not output voltage, and are in a switch-off state.

During check, the contact signal acquisition circuit does not trigger the third silicon controlled rectifier SCR3 and the fourth silicon controlled rectifier SCR4, but triggers the first silicon controlled rectifier SCR1 and the second silicon controlled rectifier SCR2. In this case, the third silicon controlled rectifier SCR3 and the fourth silicon controlled rectifier SCR4 are switched off, and the contact $P_J$ breaks the contact signal control loop. While the first silicon controlled rectifier SCR1 and the second silicon controlled rectifier SCR2 are in a switch-on state, and the contact $P_J$ is connected to the online signal acquisition circuit (collector) 6 and the online check device 7.

The contact signal acquisition circuit (collector) 6 may also be flexibly composed of a solid-state relay or an electromagnetic relay and the silicon controlled rectifier.

To sum up, the present disclosure provides the contact signal acquisition circuit (collector) for online checking a gas density relay on site, which is used for the high-voltage electrical equipment. The contact signal acquisition circuit (collector) for online checking a gas density relay on site is connected to the gas density relay and the online check device on the electrical equipment, and is configured to sample the contact signal of the gas density relay. The contact signal acquisition circuit is, when in the non-checking state, relatively broken by the contact of the gas density relay in circuits. In the checking state, the contact signal control loop is disconnected to guarantee that the contact signal of the gas density relay may not be uploaded and safe operation of the power grid may not be affected. In addition, the contact of the gas density relay is connected to the online check device, such that the information of the contact action of the gas density relay may be transmitted to the online check device. The online check device tests the action value and/or the return value of the contact (an alarm or blocking contact) of the gas density relay according to the density value when the contact acts, and the gas density relay is online checked. According to the present disclosure, the gas density relay may be checked without maintenance personnel on site, such that the reliability of the power grid is greatly improved, the efficiency is greatly improved, and the cost is reduced.

The specific embodiments of the present disclosure are described in detail above, but they are merely examples, and the present disclosure is not limited to the specific embodiments described above. For those skilled in the art, any equivalent modification and substitution of the utility also falls within the scope of the present disclosure. Therefore, equivalent changes and modifications made without departing from the spirit and scope of the present disclosure should fall within the scope of the present disclosure.

What is claimed is:

1. A contact signal acquisition circuit for online checking a gas density relay on site, comprising a first connecting circuit and a second connecting circuit, the first connecting circuit connecting a contact of the gas density relay to a contact signal control loop, and the second connecting circuit connecting the contact of the gas density relay to a contact signal sampling interface of an online check device, wherein
   in a non-checking state, the contact is a normally open density relay, the second connecting circuit is disconnected or broken, and the first connecting circuit is closed; and in a checking state, the first connecting circuit is disconnected, and the second connecting circuit is connected, so as to connect the contact of the gas density relay to the contact signal sampling interface of the online check device; alternatively,
   in a non-checking state, the contact is a normally closed density relay, the second connecting circuit is disconnected or broken, and the first connecting circuit is closed; and in a checking state, the contact signal control loop is closed, the contact of the gas density relay is disconnected from the contact signal control loop, and the second connecting circuit is connected, so as to connect the contact of the gas density relay to the contact signal sampling interface of the online check device,
   wherein the second connecting circuit further comprises a photocoupler and a resistor, the photocoupler comprising a light-emitting diode and a phototransistor, the light-emitting diode being connected in series to the contact of the gas density relay to form a closed loop, an emitter of the phototransistor being grounded, a collector of the phototransistor being connected to the online check device, and the collector of the phototransistor being further connected to a power supply by means of the resistor;
   when the contact is closed, the closed loop is energized, the light-emitting diode emits light, the phototransistor is switched on by the light, and the collector of the phototransistor outputs a low level; and
   when the contact is disconnected, the closed loop is disconnected, the light-emitting diode does not emit light, the phototransistor is switched off, and the collector of the phototransistor outputs a high level.

2. The contact signal acquisition circuit for online checking a gas density relay on site according to claim 1, wherein the first connecting circuit comprises a contact signal control loop breaker, the contact signal control loop breaker being connected to the contact signal control loop of the gas density relay in series or in parallel, and the second connecting circuit comprises a contact signal sampler, the contact signal sampler being connected to the contact of the gas density relay and the contact signal sampling interface of the online check device.

3. The contact signal acquisition circuit for online checking a gas density relay on site according to claim 2, wherein the contact signal control loop breaker comprises one or more of an electrically controlled relay, a small electrically controlled switch, an optocoupler, a silicon controlled rectifier, a metal oxide semiconductor, i.e., MOS, field effect transistor and a bipolar junction transistor.

4. The contact signal acquisition circuit for online checking a gas density relay on site according to claim 2, wherein the contact signal sampler comprises one or more of an electrically controlled relay, a small electrically controlled switch, an optocoupler, a silicon controlled rectifier, a MOS field effect transistor and a bipolar junction transistor.

5. The contact signal acquisition circuit for online checking a gas density relay on site according to claim 2, wherein the contact signal control loop breaker is a first relay, and the contact signal sampler is a second relay, the first relay being provided with at least one normally closed contact, and the second relay being provided with at least one normally open contact, the normally closed contact and the normally open contact being opposite in connection/disconnection state, the normally closed contact being connected in series to the contact signal control loop, and the normally open contact being connected to the contact of the gas density relay; and
   in the non-checking state, the normally closed contact is closed, the normally open contact is disconnected, and the gas density relay monitors an output state of the contact in real time; and
   in the checking state, the normally closed contact is disconnected, the normally open contact is closed, and the contact of the gas density relay is connected to the contact signal sampling interface of the online check device by means of the normally open contact.

6. The contact signal acquisition circuit for online checking a gas density relay on site according to claim 5, wherein the first relay and the second relay are two independent relays or the same relay.

7. The contact signal acquisition circuit for online checking a gas density relay on site according to claim 1, wherein the second connecting circuit further comprises a first Hall current sensor and a second Hall current sensor, the first Hall current sensor, the second Hall current sensor and the contact of the gas density relay are connected in series to form a closed loop, the contact of the gas density relay is connected between the first Hall current sensor and the second Hall current sensor, and an output end of the first Hall current sensor and an output end of the second Hall current sensor are both connected to the online check device;

when the contact is closed, the closed loop is energized, and a current flows between the first Hall current sensor and the second Hall current sensor to generate induced electromotive force; and when the contact is disconnected, the closed loop is disconnected, no current flows between the first Hall current sensor and the second Hall current sensor to generate zero induced electromotive force.

8. The contact signal acquisition circuit for online checking a gas density relay on site according to claim 1, wherein the contact signal acquisition circuit is provided with at least two independent sampling contacts for connecting the contacts, so as to break a contact signal control loop of the at least two contacts, transmit information when a contact signal acts, and achieve continuous measurement without changing the contact or reselecting the contact, wherein the contact comprises, but is not limited to, one of an alarm contact, an alarm contact+a blocking contact, an alarm contact+a blocking 1 contact+a blocking 2 contact, and an alarm contact+a blocking contact+an overpressure contact.

9. The contact signal acquisition circuit for online checking a gas density relay on site according to claim 1, wherein the contact signal acquisition circuit is arranged on the gas density relay.

10. The contact signal acquisition circuit for online checking a gas density relay on site according to claim 1, wherein the contact signal acquisition circuit and the online check device are arranged together.

11. The contact signal acquisition circuit for online checking a gas density relay on site according to claim 1, wherein a voltage of the contact signal acquisition circuit for testing an action value or a switching value of the contact of the gas density relay is not less than 24 V.

12. The contact signal acquisition circuit for online checking a gas density relay on site according to claim 1, wherein the contact signal acquisition circuit further comprises a housing, and the contact signal acquisition circuit is arranged in the housing.

13. The contact signal acquisition circuit for online checking a gas density relay on site according to claim 1, wherein the contact signal acquisition circuit further comprises an anti-interference component.

14. The contact signal acquisition circuit for online checking a gas density relay on site according to claim 1, wherein the contact signal acquisition circuit is further provided with a temperature protection device for components, and the temperature protection device comprises a heater and/or a radiator, the heater being turned on when a temperature is lower than a set value, and the radiator being turned on when the temperature is higher than the set value.

15. A contact signal acquisition circuit for online checking a gas density relay on site, comprising a first connecting circuit and a second connecting circuit, the first connecting circuit connecting a contact of the gas density relay to a contact signal control loop, and the second connecting circuit connecting the contact of the gas density relay to a contact signal sampling interface of an online check device, wherein in a non-checking state, the contact is a normally open density relay, the second connecting circuit is disconnected or broken, and the first connecting circuit is closed; and in a checking state, the first connecting circuit is disconnected, and the second connecting circuit is connected, so as to connect the contact of the gas density relay to the contact signal sampling interface of the online check device; alternatively, in a non-checking state, the contact is a normally closed density relay, the second connecting circuit is disconnected or broken, and the first connecting circuit is closed; and in a checking state, the contact signal control loop is closed, the contact of the gas density relay is disconnected from the contact signal control loop, and the second connecting circuit is connected, so as to connect the contact of the gas density relay to the contact signal sampling interface of the online check device;

wherein the second connecting circuit further comprises a first photocoupler and a second photocoupler;

a light-emitting diode of the first photocoupler and a light-emitting diode of the second photocoupler are connected in parallel by means of a current limiting resistor, and then connected in series to the contact of the gas density relay to form a closed loop, and the light-emitting diode of the first photocoupler and the light-emitting diode of the second photocoupler are opposite in connection direction;

a collector of a phototransistor of the first photocoupler and a collector of a phototransistor of the second photocoupler each are connected to a power supply by means of a divider resistor, and an emitter of the phototransistor of the first photocoupler is connected to an emitter of the phototransistor of the second photocoupler to form an output end, the output end being connected to the online check device and grounded by means of a resistor;

when the contact is closed, the closed loop is energized, the first photocoupler is switched on, the second photocoupler is switched off, and the emitter of the phototransistor of the first photocoupler outputs a high level; alternatively, the first photocoupler is switched off, the second photocoupler is switched on, and the emitter of the phototransistor of the second photocoupler outputs a high level; and when the contact is disconnected, the closed loop is disconnected, the first photocoupler and the second photocoupler are switched off, and the emitter of a phototransistor of the first photocoupler and the emitter of a phototransistor of the second photocoupler output low levels.

16. The contact signal acquisition circuit for online checking a gas density relay on site according to claim 15, wherein the second connecting circuit further comprises a first zener diode group and a second zener diode group, the first zener diode group and the second zener diode group being connected in parallel to the contact signal control loop, the first zener diode group and the second zener diode group being opposite in connection direction, and the first zener diode group and the second zener diode group each being composed of one, two or more zener diodes connected in series.

17. The contact signal acquisition circuit for online checking a gas density relay on site according to claim 16, wherein the first zener diode group comprises a first zener diode and a second zener diode connected in series, a cathode of the first zener diode is connected to an anode of the second zener diode, the second zener diode group comprises a third zener diode and a fourth zener diode connected in series, and an anode of the third zener diode is connected to a cathode of the fourth zener diode.

18. A contact signal acquisition circuit for online checking a gas density relay on site, comprising a first connecting circuit and a second connecting circuit, the first connecting circuit connecting a contact of the gas density relay to a contact signal control loop, and the second connecting circuit connecting the contact of the gas density relay to a contact signal sampling interface of an online check device, wherein
- in a non-checking state, the contact is a normally open density relay, the second connecting circuit is disconnected or broken, and the first connecting circuit is closed; and in a checking state, the first connecting circuit is disconnected, and the second connecting circuit is connected, so as to connect the contact of the gas density relay to the contact signal sampling interface of the online check device; alternatively,
- in a non-checking state, the contact is a normally closed density relay, the second connecting circuit is disconnected or broken, and the first connecting circuit is closed; and in a checking state, the contact signal control loop is closed, the contact of the gas density relay is disconnected from the contact signal control loop, and the second connecting circuit is connected, so as to connect the contact of the gas density relay to the contact signal sampling interface of the online check device;
- wherein the second connecting circuit further comprises a first silicon controlled rectifier, a second silicon controlled rectifier, a third silicon controlled rectifier and a fourth silicon controlled rectifier; and
- the first silicon controlled rectifier and the third silicon controlled rectifier, which are connected in series, as well as the second silicon controlled rectifier and the fourth silicon controlled rectifier, which are connected in series, form a series-parallel closed loop with a series circuit composed of the first silicon controlled rectifier and the third silicon controlled rectifier, one end of the contact of the gas density relay is electrically connected to a circuit between the first silicon controlled rectifier and the third silicon controlled rectifier by means of a circuit, and the other end of the contact of the gas density relay is electrically connected to a circuit between the second silicon controlled rectifier and the fourth silicon controlled rectifier by means of a circuit.

19. The contact signal acquisition circuit for online checking a gas density relay on site according to claim 18, wherein a cathode of the first silicon controlled rectifier is connected to the online check device, an anode of the first silicon controlled rectifier is connected to a cathode of the third silicon controlled rectifier, a control electrode of the first silicon controlled rectifier and a control electrode of the third silicon controlled rectifier are connected to the online check device, a cathode of the second silicon controlled rectifier is connected to the online check device, an anode of the second silicon controlled rectifier is connected to a cathode of the fourth silicon controlled rectifier, and a control electrode of the second silicon controlled rectifier and a control electrode of the fourth silicon controlled rectifier are connected to the online check device.

\* \* \* \* \*